United States Patent
Chen

(10) Patent No.: US 10,060,044 B2
(45) Date of Patent: Aug. 28, 2018

(54) POLARIZING APPARATUS AND POLARIZING METHOD

(71) Applicant: Xianfeng Chen, Kanagawa (JP)

(72) Inventor: Xianfeng Chen, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 17 days.

(21) Appl. No.: 15/290,092

(22) Filed: Oct. 11, 2016

(65) Prior Publication Data

US 2017/0114473 A1 Apr. 27, 2017

(30) Foreign Application Priority Data

Oct. 21, 2015 (JP) ................. 2015-207131

(51) Int. Cl.

| | | |
|---|---|---|
| C30B 1/04 | (2006.01) | |
| C30B 1/02 | (2006.01) | |
| C30B 1/08 | (2006.01) | |
| C30B 28/02 | (2006.01) | |
| C30B 29/32 | (2006.01) | |
| C30B 30/02 | (2006.01) | |
| H01L 41/39 | (2013.01) | |
| H01L 41/257 | (2013.01) | |
| H01L 41/318 | (2013.01) | |
| H01L 41/187 | (2006.01) | |

(52) U.S. Cl.
CPC ............... C30B 1/023 (2013.01); C30B 1/08 (2013.01); C30B 28/02 (2013.01); C30B 29/32 (2013.01); C30B 30/02 (2013.01); *H01L 41/257* (2013.01); *H01L 41/318* (2013.01); *H01L 41/39* (2013.01); *H01L 41/1876* (2013.01)

(58) Field of Classification Search
CPC .. C30B 1/00; C30B 1/04; C30B 29/24; C30B 33/04
See application file for complete search history.

(56) References Cited

U.S. PATENT DOCUMENTS

| | | | | |
|---|---|---|---|---|
| 3,734,625 | A * | 5/1973 | Aagard | G11B 11/10 |
| | | | | 356/369 |
| 7,304,880 | B2 * | 12/2007 | Mizuuchi | G11C 11/22 |
| | | | | 257/E45.003 |
| 7,772,747 | B2 | 8/2010 | Fujii et al. | |
| 2003/0180984 | A1 * | 9/2003 | Tatsumi | C23C 14/165 |
| | | | | 438/105 |
| 2007/0069263 | A1 * | 3/2007 | Mizuuchi | G11C 11/22 |
| | | | | 257/295 |
| 2014/0216643 | A1 | 8/2014 | Chen | |
| 2015/0068673 | A1 | 3/2015 | Chen | |
| 2016/0023466 | A1 | 1/2016 | Chen | |

FOREIGN PATENT DOCUMENTS

| | | |
|---|---|---|
| JP | 5410686 | 2/2014 |
| JP | 2014-154581 | 8/2014 |
| JP | 2014-175551 | 9/2014 |

* cited by examiner

*Primary Examiner* — Robert M Kunemund
(74) *Attorney, Agent, or Firm* — IPUSA, PLLC

(57) ABSTRACT

A polarizing apparatus includes an electromagnetic wave irradiator to irradiate a target film with an electromagnetic wave to heat the target film; and an electric charge generator to apply an electric field to the target film.

8 Claims, 5 Drawing Sheets

POLARIZING APPARATUS AND POLARIZING METHOD

BACKGROUND OF THE INVENTION

1. Field of the Invention

The disclosures herein generally relate to a polarizing apparatus and a polarizing method.

2. Description of the Related Art

A piezoelectric material is used for various devices including sensors or actuators because the piezoelectric material has a property of converting a displacement or a pressure to an electrical signal and a property of converting the electric signal to the displacement or the pressure. For example, PZT is used as the piezoelectric material.

A Chemical Solution Deposition (CSD) method, a sputtering method, a Chemical Vapor Deposition (CVD) method, or the like is used as a method for creating a PZT crystal film, which is a piezoelectric film. In particular, in comparison with other methods, the CSD method is widely used as an extremely effective method of forming the film because the CSD method has a merit of being able to uniformly coat, in a wide area at low cost, a multicomponent oxide in composition as designed.

When the CSD method is used to create the PZT crystal film, a chemical liquid such as sol-gel (SG) liquid of PZT, for example, is applied onto a substrate. After a drying treatment is performed, the substrate is externally heated by an electric furnace, a Rapid Thermal Annealing (RTA) apparatus, or the like to perform a several minutes heating treatment at a temperature equal to or higher than 600° C. to crystallize the film. Processes of the application, the drying treatment, and the crystallization are repeatedly performed to create a thick film.

When the PZT crystal film is used to create a piezoelectric device having high safety, it is required to apply an appropriate electric field to the PZT crystal film and to perform polarization processing. The polarization processing is sometimes referred to as a polling processing, an aging processing, or the like.

For example, Japanese Examined Patent Publication No. 5410686 discloses a process for producing a piezoelectric film having spontaneous polarization. According to the process disclosed in Japanese Examined Patent Publication No. 5410686, a piezoelectric film is formed by a sputtering method at a film formation temperature equal to or higher than a Curie point. After the film formation and before the temperature of the piezoelectric film becomes equal to or lower than the Curie point, application of an electric field to the piezoelectric film from outside is started and polarization processing is performed until the temperature of the piezoelectric film becomes equal to or lower than the Curie point.

SUMMARY OF THE INVENTION

It is a general object of at least one embodiment of the present disclosure to provide a polarizing apparatus and a polarizing method that substantially obviate one or more problems caused by the limitations and disadvantages of the related art.

According to one aspect of the present disclosure, there is provided a polarizing apparatus including an electromagnetic wave irradiator to irradiate a target film with an electromagnetic wave to heat the target film; and an electric charge generator to apply an electric field to the target film.

DESCRIPTION OF THE PREFERRED EMBODIMENTS

Figure 1:
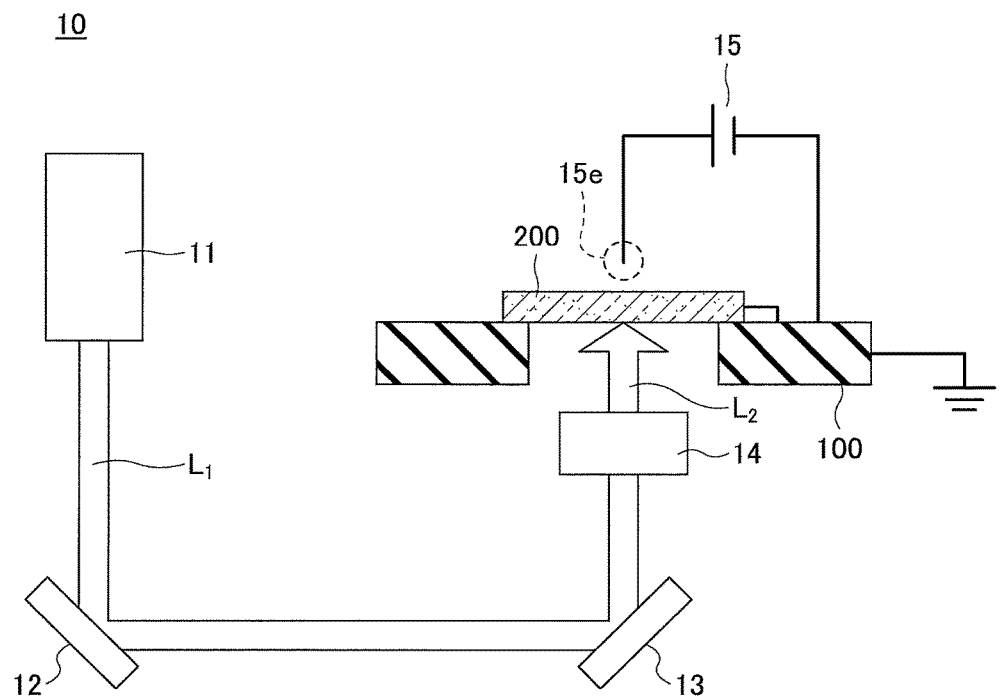
FIG. 1 is a drawing illustrating an example of a polarizing apparatus according to a first embodiment.

Hereinafter, the embodiments for implementing the present disclosure are described with reference to the accompanying drawings. In the drawings, identical reference numerals may be given to identical elements, and thereby overlapped descriptions may be omitted as appropriate. An object of the embodiments is to provide a polarizing apparatus and a polarizing method that can perform crystallization processing and polarization processing on a target film produced by a Chemical Solution Deposition (CSD) method. Also, the polarizing apparatus and the polarizing method may perform the crystallization processing and the polarization processing on a target film produced by another method.

First Embodiment

Although a polarizing apparatus that emits laser light as an example of an electromagnetic wave (electromagnetic waves) is described in a first embodiment, the present disclosure is not limited to this.

(Structure of Polarizing Apparatus)

An example of a structure of a polarizing apparatus 10 will be described. FIG. 1 is a drawing illustrating an example of the polarizing apparatus 10 according to the first embodiment. As illustrated in FIG. 1, the polarizing apparatus 10 includes a light source 11, a mirror 12, a mirror 13, a beam forming optical element 14, and a discharger 15. Also, an object 200 to be heated (target object) is placed on a stage 100. The light source 11 is a typical example of an electromagnetic wave irradiator according to the present disclosure. The discharger is a typical example of an electric charge generator according to the present disclosure. Here, the discharger 15 side of the object 200 to be heated (upper side with respect to the object 200 to be heated in FIG. 1) may be referred to as a front surface side for convenience sake. Also, the beam forming optical element 14 side of the object 200 to be heated (lower side with respect to the object 200 to be heated in FIG. 1) may be referred to as a back surface side for convenience sake.

At room temperature, while locally irradiating an electromagnetic wave absorbing layer with laser light $L_2$ from the back surface side of the object 200 to be heated, the polarizing apparatus 10 causes the discharger 15 to perform discharge locally from the front surface side of the object 200 to be heated. Thereby, the polarizing apparatus 10 crystallizes and polarizes a target film (film to be processed) in the object 200 to be heated. For example, the room temperature (ambient temperature) is in a range of from 1° C. to 40° C.

According to the polarizing apparatus 10, an area of a region where the target film is irradiated with laser light emitted from the light source 11 is smaller than an area of the target film. Also, an area of a region where an electric field is applied to the target film by the discharger 15 is smaller than the area of the target film. Also, a side, where the electromagnetic wave emitted from the light source 11 enters into the target film, and a side, where the electric field is applied to the target film by the discharger 15, are opposite to each other with respect to the target film.

The light source 11 has a function to emit laser light $L_1$. For example, the light source 11 is a continuous oscillation semiconductor laser that can emit the laser light $L_1$ having a wavelength of approximately 1470 nm. A light path of the laser light $L_1$ emitted from the light source 11 is converted by the mirror 12. After that, the light path of the laser light $L_1$ is converted by the mirror 13. Then, the laser light $L_1$ enters into the beam forming optical element 14.

For example, a plurality of lenses may be combined to structure the beam forming optical element 14. The beam forming optical element 14 forms the laser light $L_1$ into a predetermined shape as laser light $L_2$. For example, the beam forming optical element 14 can form the shape of the laser light $L_1$, which is the incident light, into the laser light $L_2$ having a square shape and a flat top energy profile. For example, a length of each side of the square shape is approximately 400 μm.

Here, the light source 11 may be arranged at a position where the light source 11 can directly irradiate the beam forming optical element 14 with the laser light $L_1$ without using the mirrors 12 and 13.

The laser light $L_2$, formed by the beam forming optical element, 14 into the predetermined shape, is emitted to the object 200 to be heated placed on the stage 100 from the back surface side. For example, the stage 100 is movable in XY direction (in a plane substantially perpendicular to a light axis of the laser light $L_2$ that enters into the object 200 to be heated, for example). That is, the stage 100 is a conveying unit (moving unit) that relatively moves the object 200 to be heated and an irradiation position of the laser light $L_2$ emitted from the back surface side of the object 200 to be heated.

The discharger 15 is disposed on the front surface side of the object 200 to be heated. The discharger 15 has a function to apply an electric field to the target film in the object 200 to be heated to perform polarization processing on the target film in the object 200 to be heated. For example, a corona discharge device may be used as the discharger 15.

(Object to be Heated)

Figure 2:
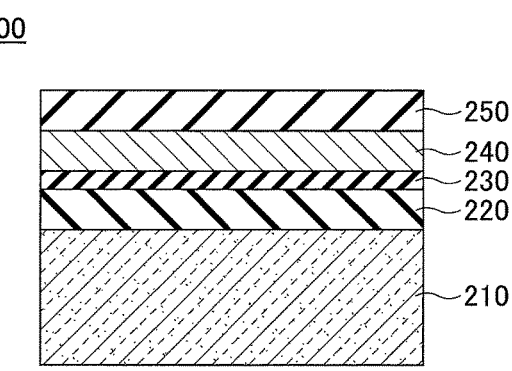
FIG. 2 is a cross sectional view of an example of a structure of an object to be heated according to the first embodiment.

Next, an example of the object 200 to be heated will be described. FIG. 2 is a cross sectional view of an example of a structure of the object 200 to be heated according to the first embodiment. FIG. 2 illustrates the target film that has been produced by the CSD method, for example. As illustrated in FIG. 2, the object 200 to be heated includes a silicon substrate 210, a silicon oxide film ($SiO_2$) film 220, a titanium oxide film (TiOx film) 230, a platinum film (Pt film) 240, and an amorphous PZT film 250.

The silicon oxide film 220, the titanium oxide film 230, the platinum film 240, and the amorphous PZT film 250 are formed on the front surface side of the silicon substrate 210. The electromagnetic wave such as the laser light $L_2$ is emitted to the object 200 to be heated from the back surface side of the silicon substrate 210 to change a film property of the amorphous PZT film 250 formed on the platinum film 240. The amorphous PZT film 250 is an example of the target film (film to be processed).

The silicon substrate 210 is a part that is a base substance to form each film. A film thickness of the silicon substrate 210 may be approximately 500 μm, for example. The silicon oxide film 220 is formed on the front surface of the silicon substrate 210. A film thickness of the silicon oxide film 220 may be approximately 600 nm, for example. For example, a CVD method, a thermal oxidation method or the like may be used to form the silicon oxide film 220.

The titanium oxide film 230 is layered on the silicon oxide film 220. A film thickness of the titanium oxide film 230 may be approximately 50 nm, for example. For example, a sputtering method, the CVD method, or the like may be used to form the titanium oxide film 230.

The platinum film 240 is layered on the titanium oxide film 230. The platinum film 240 has a function as an electromagnetic wave absorbing layer that absorbs the electromagnetic wave emitted from the back surface side of the silicon substrate 210 to heat the target film formed on the platinum film 240. The platinum film 240 has a film thickness sufficient to absorb the emitted electromagnetic wave. The film thickness of the platinum film 240 may be approximately 100 nm, for example. For example, a sputtering method, an electron beam (EB) deposition method, or the like may be used to form the platinum film 240.

Another heat resistant film having a melting point equal to or higher than 1000° C. may be used as the electromagnetic wave absorbing layer instead of the platinum film 240. As an example of the heat resistant film, a metal film may be used that includes any metal of Ir, Pd, Rh, W, Fe, Ni, Ta, Cr, Zr, Ti, Au, and Mo. Also, as another example of the heat resistant film, a metal alloy film, which includes an alloy of any of the above-described metals, or a laminated film, which is formed by suitably selecting the metal film or the metal alloy film, and laminating a plurality of the selected films, may be used.

The amorphous PZT film 250 is the target film formed on the platinum film 240 that is the electromagnetic wave absorbing layer. Here, "PZT" means a solid solution of lead zirconate ($PbZrO_3$) and lead titanate ($PbTiO_3$). Physical properties of PZT differ depending on a ratio between $PbZrO_3$ and $PbTiO_3$. For example, a specific PZT can be used whose ratio of $PbZrO_3$ to $PbTiO_3$ is 53 to 47. Such a specific PZT may be represented by a chemical formula of $Pb(Zr_{0.53}, Ti_{0.47})O_3$. More generally, the specific PZT may be denoted as PZT (53/47).

For example, a CSD method or the like may be used to form the amorphous PZT film 250 on the front surface of the platinum film 240. A film thickness of the amorphous PZT film 250 may be approximately 50 nm, for example.

When the amorphous PZT film 250 is formed by the CSD method, as a starting material, for example, a mixture of lead acetate, a zirconium alkoxide compound, and a titanium alkoxide compound may be used. The starting material is dissolved in methoxyethanol as a common solvent. In this manner, a homogeneous solvent is prepared. This homogeneous solvent is referred to as a "PZT precursor solution." In the PZT precursor solution, a solid concentration of the complex oxide may be adjusted to be in a range from 0.1 mol/l to 0.7 mol/l, for example.

A mixing ratio (mixing amount) among lead acetate, the zirconium alkoxide compound, and the titanium alkoxide compound may be suitably selected by a person skilled in the art, depending on desired composition of PZT (i.e., a ratio between $PbZrO_3$ and $PbTiO_3$). For example, the above-described PZT (53/47) may be used.

Next, for example, using a spin coating method or the like, the PZT precursor solution is applied (coated) to the front surface of the platinum film 240 to form a coating film. Then, a heat treatment is applied to the coating film for approximately one minute by using a hot plate of approximately 120° C., for example. After that, another heat treatment is applied to the coating film for approximately one minute to ten minutes by using a hot plate of approximately from 180° C. to 500° C. In this manner, the amorphous PZT film 250 is formed on the front surface of the platinum film 240.

(Method of Crystallization and Polarization of the Object to be Heated)

Next, a method for using the polarizing apparatus 10 to crystallize and polarize the amorphous PZT film 250, which is the target film, is described.

Figure 3A:
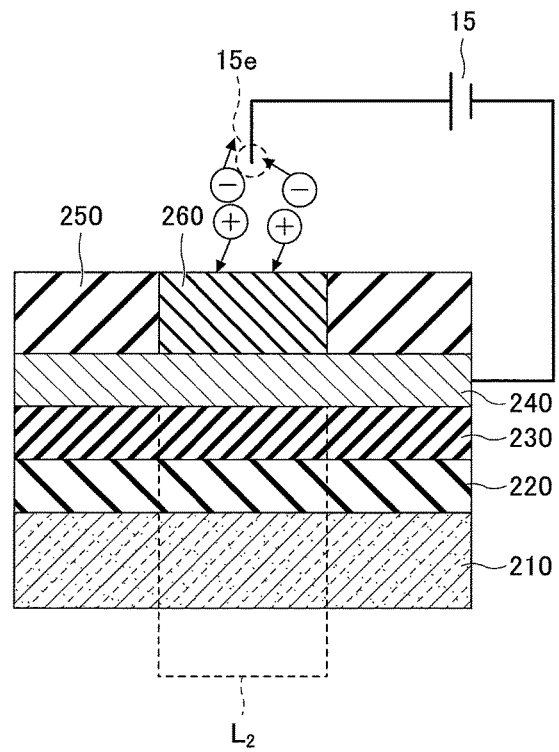
FIGS. 3A and 3B are drawings that describe a method of using the polarization apparatus according to the first embodiment to perform polarization.

As illustrated in FIG. 3A, according to the first embodiment, at room temperature, the polarizing apparatus 10 is used to locally irradiate the platinum film 240, which is the electromagnetic wave absorbing layer, with the laser light $L_2$ from the back surface side of the object 200 to be heated and to cause the discharger 15 to perform the discharge from the front surface side of the object 200 to be heated.

The wavelength of the laser light $L_2$ has a permeation property with respect to the silicon substrate 210, the silicon oxide film 220, and the titanium oxide film 230. For example, the wavelength of the laser light $L_2$ is approximately 1470 nm. Accordingly, 90% or more of the energy of the laser light $L_2$ emitted from the back surface side of the silicon substrate 210 reaches the platinum film 240.

The platinum film 240 has a significantly large absorption coefficient with respect to the wavelength of approximately 1470 nm. The absorption coefficient is approximately $6 \times 10^5$ cm$^{-1}$. For example, in the platinum film 240 having the film thickness of approximately 100 nm, a transmittance of light having the wavelength of approximately 1470 nm is less than or equal to one percent. Accordingly, almost all light energy of the laser light $L_2$ having the wavelength of approximately 1470 nm that reaches the platinum film 240 is absorbed by the platinum film 240. The light energy absorbed by the platinum film 240 is converted into heat to heat the platinum film 240. The heat of the platinum film 240 diffuses in the amorphous PZT film 250 formed on the front surface of the platinum film 240. In the heated portion of the amorphous PZT film 250, film properties are changed. Specifically, for example, the amorphous PZT film 250 becomes a PZT crystal film 260 having a perovskite structure. In other words, the predetermined region of the amorphous PZT film 250 crystallized with the laser $L_2$ has the perovskite structure.

In general, a crystallization temperature of an amorphous PZT film is approximately from 600° C. to 850° C., which is significantly lower than a melting point of platinum (which is 1768° C.). Accordingly, the energy density and the irradiation time of the laser light $L_2$ that enters into the platinum film 240 are controlled to be able to locally heat and crystallize the amorphous PZT film 250 without damaging the platinum film 240. The energy density of the laser light $L_2$ may be adjusted to be approximately in a range of from $1 \times 10^2$ W/cm$^2$ to $1 \times 10^6$ W/cm$^2$, for example. The irradiation time of the laser light $L_2$ may be adjusted to be approximately in a range of from 1 ms to 200 ms, for example.

As described above, the polarizing apparatus 10 performs the local heating with the laser light $L_2$ and uses the discharger 15 to perform the discharge. A cathode (earth) of a power source of the discharger 15 is coupled to the stage 100 and to the platinum film 240 of the object 200 to be heated. Also, an anode of the power source of the discharger 15 is disposed such that an anode end 15e, disposed above the amorphous PZT film 250 of the object 200 to be heated, faces the irradiation position of the laser light $L_2$ in a non-contact manner through a region where the amorphous PZT film 250 crystallizes.

A voltage is applied to the anode end 15e of the power source of the discharger 15 to continually ionize molecules in the air. The ionized positive and negative ions move along the electric field generated between the anode end 15e and the platinum film 240, which is the cathode. The generated positive ions are accumulated on the surface of the amorphous PZT film 250. Because the electric field is formed in the surface of the amorphous PZT film 250 by the positive ions accumulated on the surface of the amorphous PZT film 250, polarization processing can be performed on the surface of the amorphous PZT film 250.

Figure 3B:
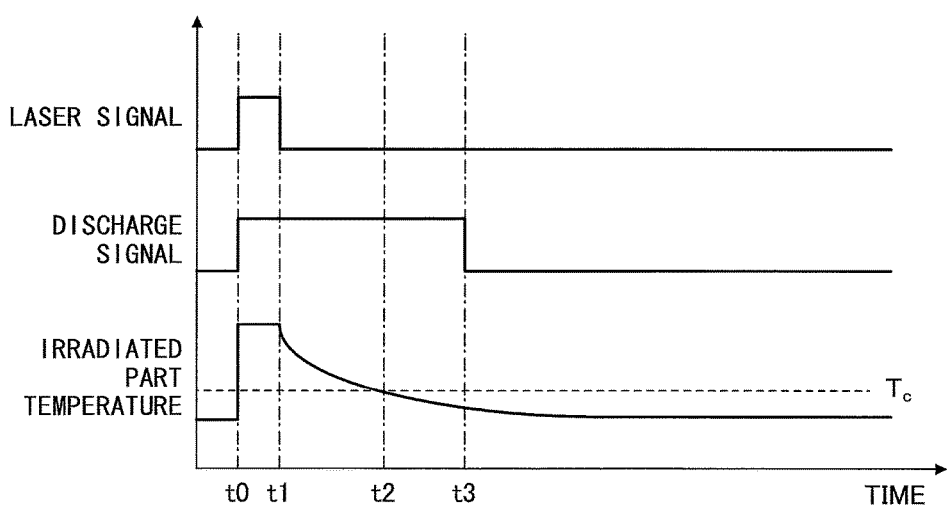

FIG. 3B illustrates a relationship between a timing of a laser signal, a timing of a discharge signal, and a temperature of a part irradiated with the laser light $L_2$ of the amorphous PZT film 250 (irradiated part temperature). The laser signal is a signal representing a timing of irradiating the amorphous PZT film 250 with the laser light $L_2$. The discharge signal is a signal representing a timing of applying the voltage to the anode end 15e of the power source of the discharger 15.

As illustrated in FIG. 3B, first, the laser signal and the discharge signal are simultaneously turned on at time t0. Then, only the laser signal is turned off at time t1. At time t0, a predetermined region of the amorphous PZT film 250 is instantaneously heated by the energy of the laser light $L_2$, and the crystallization is started. At this time, atoms in the amorphous PZT film 250 are in the violently movable state and susceptible to an external electric field.

At time t1, the temperature of the predetermined region of the amorphous PZT film 250 that has lost the heat source decreases gradually. In other words, the temperature starts to decrease when the laser signal is turned off at time t1. Then, the temperature of the predetermined region of the amorphous PZT film 250 becomes equal to a Curie temperature Tc of the amorphous PZT film 250 at time t2. Thereafter, the temperature further decreases. Here, the discharge signal is kept on at time t2.

Until time t2, because the temperature of the amorphous PZT film 250 is sufficiently high, it is easy to uniform (align) polarization directions of crystal grains in the amorphous PZT film 250. The discharge signal is turned off at time t3 at which the temperature of the amorphous PZT film 250 becomes sufficiently lower than the Curie temperature Tc.

In this way, according to the first embodiment, the polarizing apparatus 10 is used to irradiate the platinum film 240, which is the electromagnetic wave absorbing layer, with the laser light $L_2$ to heat the predetermined region of the amorphous PZT film 250 to the temperature equal to or higher than the Curie temperature Tc of the amorphous PZT film 250. Then, while the temperature of the predetermined region of the amorphous PZT film 250 is equal to or higher than the Curie temperature Tc, the application of the electric field to the predetermined region of the amorphous PZT film 250 is started. The application of the electric field is continued until the temperature of the predetermined region of the amorphous PZT film 250 becomes lower than the Curie temperature Tc.

In this way, it becomes possible to make the PZT crystal film 260, obtained by crystallizing the amorphous PZT film 250, a film having spontaneous polarization by performing only the processing at a room temperature without performing a particular polarization process performed in a high temperature environment, for example.

Also, according to the polarizing apparatus 10, it is possible to crystallize the amorphous PZT film 250 by performing the local heating with the laser light $L_2$. Thus, it is possible to avoid effects on the vicinity of the area desired to be crystallized. Also, because the anode end 15e of the discharger 15 can be disposed at the position close to the amorphous PZT film 250, it is possible to perform the polarization processing at a low voltage.

In a case where it is desired to crystallize a wide region in the amorphous PZT film 250, the laser light $L_2$ is emitted while moving the stage 100 in XY direction (for example, in a plane substantially perpendicular to the light axis of the laser light $L_2$ that enters into the object 200 to be heated), for example, to relatively move the laser light $L_2$ and the object 200 to be heated. In this way, the amorphous PZT film 250 is sequentially crystallized. Thereby, it becomes possible crystallize the entire region desired to be crystallized in the amorphous PZT film 250 eventually. The whole of the amorphous PZT film 250 may be crystallized.

Also, after forming the PZT crystal film in the predetermined region of the amorphous PZT film 250 on the platinum film 240, the amorphous PZT film 250 may be further layered and heated similarly. Thereby, a plurality of PZT crystal films each of which has a film thickness of approximately 50 nm can be layered. For example, when this processing is repeated for approximately 30 times, a thick PZT crystal film having a total thickness of approximately 1.5 µm can be produced.

According to the first embodiment, it is possible to polarize a thick film that has been produced by the CSD method. Also, because the polarizing apparatus 10 according to the first embodiment uses the light source 11 that emits the laser light to heat the target film, in comparison with a configuration using an electric furnace or a RTA apparatus, it is possible to apply the electric field to the target film immediately after heating the target film. Further, because the polarizing apparatus 10 according to the first embodiment can polarizes the target film with the discharger 15 while irradiating the target film with the laser light $L_2$ to crystallize the target film, it is possible to perform preferable polarization. In other words, depolarization is less likely to occur according to the first embodiment.

Although the continuous oscillation semiconductor laser, whose wavelength is approximately 1470 nm, is used as an example of the light source 11 in the first embodiment, pulse oscillation laser light or continuous oscillation laser light having a permeation property with respect to the silicon substrate 210 and the like may be used. For example, the wavelength of the laser light may be equal to or higher than 1200 nm. Further, square in the first embodiment, the beam shape of the laser light $L_2$ may be another shape such as a rectangle shape, a circular shape, and an elliptical shape.

Although the laser light $L_2$ has the flat top energy distribution in the first embodiment, the laser light $L_2$ may have an energy distribution such as a gauss distribution, for example.

Although the laser signal and the discharge signal are turned on at the same time in the first embodiment, the discharge signal may be turned on after the laser signal is turned on. That is, because it is sufficient to start the application of the electric field while the temperature of the predetermined region of the amorphous PZT film 250 is equal to or higher than the Curie temperature Tc, the discharge signal may be turned on between time t0 and time t2.

Although the PZT film is used as the target film in the first embodiment, another ferroelectric film, which may not include Pb, may be used as the target film.

Second Embodiment

An example of a polarizing apparatus according to a second embodiment having a different structure from the first embodiment is described. In the second embodiment, identical reference numerals may be attached to identical elements that have been described already, and thereby overlapped explanations may be omitted as appropriate.

Figure 4:
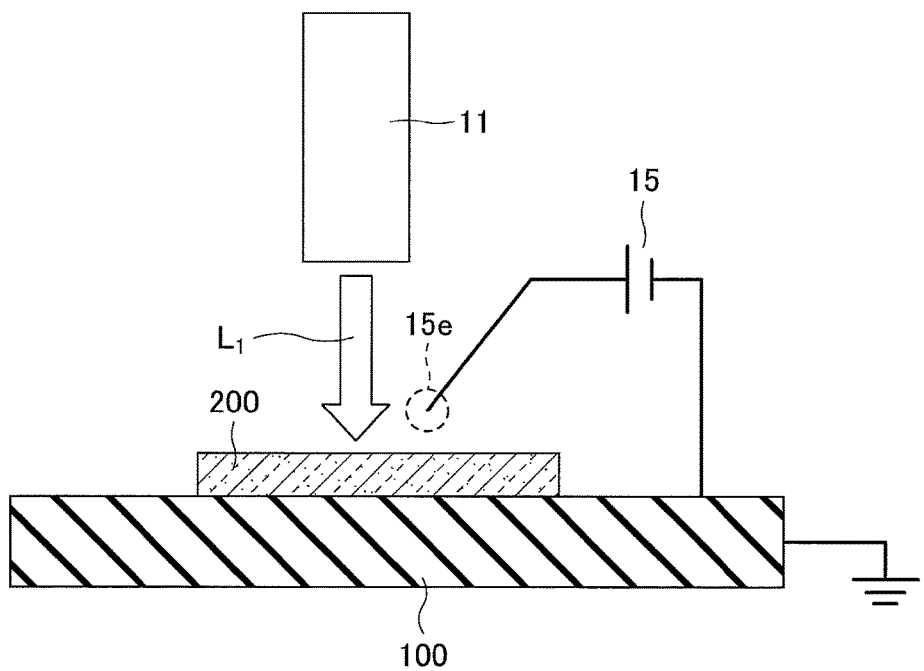
FIG. 4 is a drawing illustrating an example of a polarizing apparatus according to a second embodiment.

FIG. 4 is a drawing illustrating an example of a polarizing apparatus 20 according to the second embodiment. As illustrated in FIG. 4, the polarizing apparatus 20 differs from the polarizing apparatus 10 (see FIG. 1) in that the light source 11 is disposed on the same side as the discharger 15 with respect to the object 200 to be heated, and the cathode (earth) of the power source of the discharger 15 is coupled to only the stage 100. Also, the discharger 15 is obliquely disposed such that the anode end 15e is located near the region to which the laser light $L_2$ is emitted.

That is, at room temperature, while locally and directly irradiating the amorphous PZT film 250 with the laser light $L_2$ from the front surface side of the object 200 to be heated, the polarizing apparatus 20 causes the discharger 15 to perform the discharge from the front surface side of the object 200 to be heated. In this way, the amorphous PZT film 250 in the object 200 to be heated crystallizes and polarizes.

For example, the light source 11 is a continuous oscillation laser that can emit laser light having a wavelength of approximately 532 nm. A method of polarization and crystallization is similar to the method of the first embodiment described with reference to FIG. 3B and the like. According to the second embodiment, the PZT crystal film 260 having spontaneous polarization can be obtained by a simple apparatus structure and splicing method.

According to the second embodiment, it is possible to produce the compact polarizing apparatus having a simple structure and basic functions.

Third Embodiment

An example of a polarizing apparatus according to a third embodiment having a different structure from the first and second embodiments is described. In the third embodiment, identical reference numerals may be attached to identical elements that have been described already, and thereby overlapped explanations may be omitted as appropriate.

Figure 5:
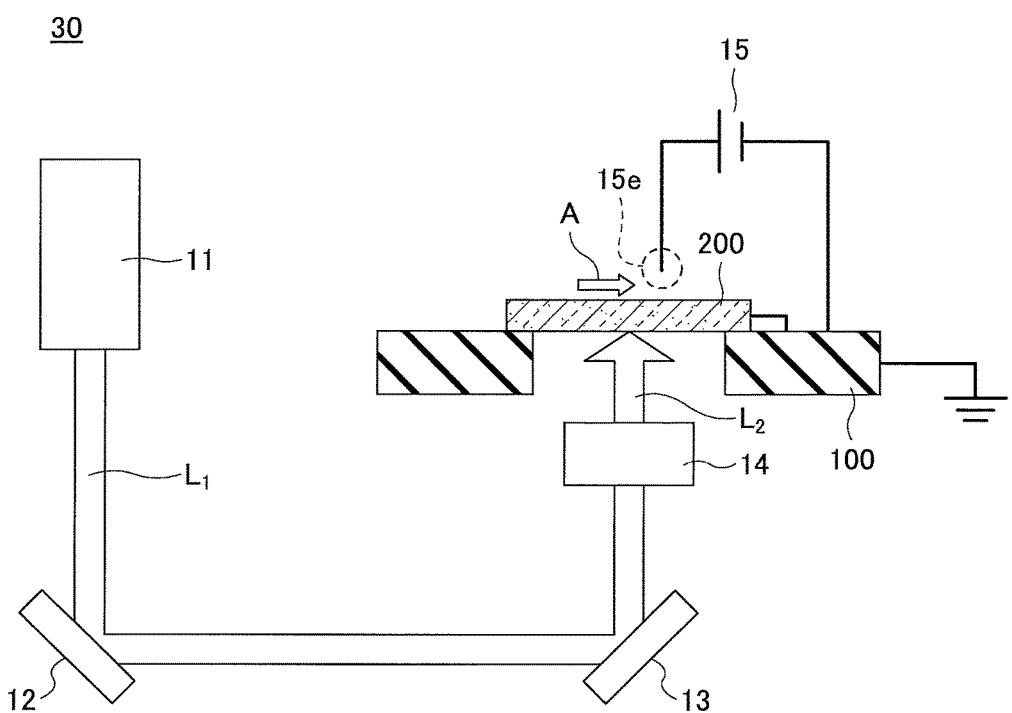
FIG. 5 is a drawing illustrating an example of a polarizing apparatus according to a third embodiment.

FIG. 5 is a drawing illustrating an example of a polarizing apparatus 30 according to the third embodiment. As illustrated in FIG. 5, the polarizing apparatus 30 differs from the polarizing apparatus 10 (see FIG. 1) in that the anode end 15e is disposed, via the predetermined region where the amorphous PZT film 250 is crystallized, at a position different from the irradiation position of the laser light $L_2$ in a non-contact manner.

Specifically, the anode end 15e is shifted, with respect to the irradiation position of the laser light $L_2$, in a direction A side in which the object 200 to be heated moves together with the stage 100. That is, while moving the amorphous PZT film 250, the polarizing apparatus 30 irradiates the predetermined region with the laser light $L_2$ and applies the electric field at a position behind, with respect to the moving direction of the amorphous PZT film 250, the position to which the laser light $L_2$ is emitted. In other words, in the moving direction of the object 200 to be heated (direction A), the discharger 15 applies the electric field at a more downstream side position than a position to which the laser light L$_2$ is emitted. A shift length between the irradiation position of the laser light L$_2$ and the anode end 15e is sufficiently small as seen from the normal direction of the object 200 to be heated. For example, the shift length is approximately 500 µm.

As described above, the region, where the electric field is applied to the amorphous PZT film 250 by the discharger 15, is different from the region, where the amorphous PZT film 250 is irradiated with the laser light L$_2$ made from the laser light L$_1$ emitted from the light source 11.

While moving in direction A, the part heated by the laser light L$_2$ can receive, in a substantially same state, similar polarization processing while the temperature decreases to the Curie temperature Tc. Accordingly, it is possible to perform uniform polarization processing for a relatively large area. Here, it becomes possible to perform the polarization processing on an arbitrary area (desired area) by controlling the polarization strength, the moving speed, and the applied voltage.

Figure 6A:
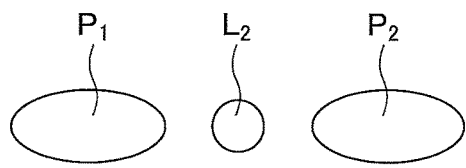
FIGS. 6A to 6D illustrate examples of a positional relationship between a region to which an electric field is applied and a region to which laser light is emitted.

In the embodiment, the part (region where the electric field is applied to the target film) on which the polarization processing is performed is disposed on one side of the region to which the laser light L$_2$ is emitted. However, as illustrated in FIG. 6A, for example, the parts P$_1$ and P$_2$ on which the polarization processing is performed may be disposed on both sides of the region to which the laser light L$_2$ is emitted.

Figure 6B:
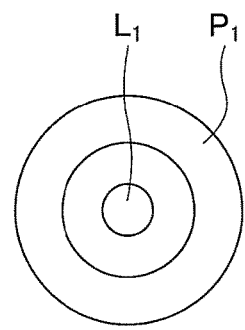
Figure 6C:
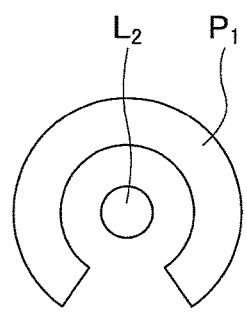

Also, as illustrated in FIGS. 6B and 6C, the part P$_1$, on which the polarization processing is performed, may be disposed entirely or partly around the region to which the laser light L$_2$ is emitted. According to the configurations illustrated in FIGS. 6A to 6C, it becomes possible to increase degree of freedom of the moving direction of the object 200 to be heated.

Figure 6D:
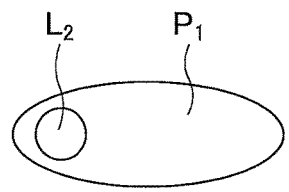

Also, as illustrated in FIG. 6D, the part P$_1$, on which the polarization processing is performed, may have a portion overlapped with the region where the target film is irradiated with the laser light L$_2$.

Although the polarization part and the heated part are a circular shape and/or an elliptical shape in the embodiment, the polarization part and the heated part may be another shape such as a square shape and a rectangle shape, for example.

As described above, although the preferable embodiments are described specifically, the present disclosure is not limited to these embodiments, but various variations and modifications may be made without departing from the scope of the present disclosure.

For example, the electromagnetic wave emitted to the electromagnetic absorbing layer is not limited to the laser light. Any electromagnetic wave (electromagnetic wave absorbed by the electromagnetic absorbing layer) may be used as long as the wave can heat the electromagnetic absorbing layer. For example, light that a flash lamp or the like emits may be used.

The present application is based on and claims the benefit of priority of Japanese Priority Application No. 2015-207131 filed on Oct. 21, 2015, with the Japanese Patent Office, the entire contents of which are hereby incorporated by reference.

What is claimed is:

1. A polarizing method comprising:
forming a piezoelectric film by a chemical solution deposition method;
irradiating the piezoelectric film with an electromagnetic wave to heat a predetermined region of the piezoelectric film to a temperature equal to or higher than a Curie temperature of the piezoelectric film;
starting to apply an electric field to the predetermined region while the temperature of the predetermined region is equal to or higher than the Curie temperature; and
continuing to apply the electric field until the temperature of the predetermined region falls below the Curie temperature.

2. The polarizing method according to claim 1,
wherein the predetermined region is irradiated with the electromagnetic wave while moving the piezoelectric film, and
wherein, in a moving direction of the piezoelectric film, the electric field is applied at a more downstream side position than a position to which the electromagnetic wave is emitted.

3. The polarizing method according to claim 1, wherein the electromagnetic wave is emitted and the electric field is applied at an ambient temperature in a range of from 1° C. to 40° C.

4. The polarizing method according to claim 1, wherein the piezoelectric film is an amorphous film.

5. The polarizing method according to claim 4, wherein the amorphous film is irradiated with the electromagnetic wave to crystallize the predetermined region of the amorphous film.

6. The polarizing method according to claim 5, wherein the predetermined region crystallized with the electromagnetic wave has a perovskite structure.

7. The polarizing method according to claim 1, wherein the piezoelectric film is a ferroelectric film.

8. A polarizing method comprising:
forming a metal film;
forming, on the metal film, a piezoelectric film by a chemical solution deposition method;
causing an electromagnetic wave emitter to emit an electromagnetic wave to an object including the metal film and the piezoelectric film, the electromagnetic wave entering the object from the metal film such that a predetermined region of the piezoelectric film is heated by the metal film to a temperature equal to or higher than a Curie temperature of the piezoelectric film;
causing an electric charge generator to start to apply an electric field to the predetermined region while the temperature of the predetermined region is equal to or higher than the Curie temperature; and
continuing to apply the electric field until the temperature of the predetermined region falls below the Curie temperature,
wherein an end, from which the electric field is applied to the predetermined region, of the electric charge generator is located closer to the piezoelectric film than the metal film is.

* * * * *